United States Patent
Tanaka

(10) Patent No.: US 12,026,107 B2
(45) Date of Patent: Jul. 2, 2024

(54) MITIGATING INTERFERENCE BETWEEN COMMANDS FOR DIFFERENT ACCESS REQUESTS IN LPDDR4 MEMORY SYSTEM

(71) Applicant: PANASONIC INTELLECTUAL PROPERTY MANAGEMENT CO., LTD., Osaka (JP)

(72) Inventor: Kazuhito Tanaka, Shiga (JP)

(73) Assignee: PANASONIC AUTOMOTIVE SYSTEMS CO., LTD., Kanagawa (JP)

( * ) Notice: Subject to any disclaimer, the term of this patent is extended or adjusted under 35 U.S.C. 154(b) by 957 days.

(21) Appl. No.: 16/923,764

(22) Filed: Jul. 8, 2020

(65) Prior Publication Data

US 2020/0331485 A1    Oct. 22, 2020

Related U.S. Application Data

(63) Continuation of application No. PCT/JP2019/037077, filed on Sep. 20, 2019.

(30) Foreign Application Priority Data

Sep. 28, 2018  (JP) ................................. 2018-186028

(51) Int. Cl.
    *G11C 7/22*      (2006.01)
    *G06F 1/04*      (2006.01)
    (Continued)

(52) U.S. Cl.
    CPC ............ *G06F 13/1689* (2013.01); *G06F 1/04* (2013.01); *G06F 13/1668* (2013.01);
    (Continued)

(58) Field of Classification Search
    CPC ................ G11C 7/22; G11C 11/40603; G11C 11/40611; G11C 11/4076
    See application file for complete search history.

(56) References Cited

U.S. PATENT DOCUMENTS

| 5,822,772 A * | 10/1998 | Chan ........................ G11C 7/22 |
| | | 711/158 |
| 2004/0120210 A1* | 6/2004 | Lee ........................... G11C 7/22 |
| | | 365/232 |

(Continued)

FOREIGN PATENT DOCUMENTS

| JP | 11-224221 | 8/1999 |
| JP | 2002-082831 | 3/2002 |

(Continued)

OTHER PUBLICATIONS

Official Communication issued in International Patent Application No. PCT/JP2019/037077, dated Dec. 10, 2019, along with an English translation thereof.

*Primary Examiner* — Mushfique Siddique

(74) *Attorney, Agent, or Firm* — GREENBLUM & BERNSTEIN, P.L.C.

(57) ABSTRACT

A command control system is provided which is configured to optimally set an output timing of a RAS command and an output timing of a CAS command for access requests different from each other. The command control system is configured to, when an output timing of a second RAS command is set in a first cycle time period which is a cycle starting from the reference time point, determine whether or not the second RAS command is output to a storage device in the first cycle time period in accordance with whether or not an output timing of a first CAS command is set in a second cycle time period constituted by a prescribed number of the cycles subsequent to the reference time point.

11 Claims, 6 Drawing Sheets

(51) Int. Cl.
  *G06F 13/16* (2006.01)
  *G11C 7/10* (2006.01)
  *G11C 8/18* (2006.01)
  *G11C 11/406* (2006.01)
  *G11C 11/4076* (2006.01)
  *G11C 11/4096* (2006.01)

(52) U.S. Cl.
  CPC .............. *G11C 7/1072* (2013.01); *G11C 7/22* (2013.01); *G11C 7/222* (2013.01); *G11C 8/18* (2013.01); *G11C 11/40603* (2013.01); *G11C 11/40611* (2013.01); *G11C 11/4076* (2013.01); *G11C 11/4096* (2013.01)

(56) References Cited

U.S. PATENT DOCUMENTS

| | | | | |
|---|---|---|---|---|
| 2010/0313052 | A1* | 12/2010 | Ueda | G06F 1/3225 |
| | | | | 711/E12.001 |
| 2010/0325375 | A1* | 12/2010 | Ueno | G06F 13/1626 |
| | | | | 711/158 |
| 2018/0357009 | A1* | 12/2018 | Ikarashi | G06F 3/0655 |
| 2023/0325121 | A1* | 10/2023 | Shiraishi | G06F 3/0659 |
| | | | | 711/154 |

FOREIGN PATENT DOCUMENTS

| | | |
|---|---|---|
| JP | 2011-003160 | 1/2011 |
| JP | 2017-097618 | 6/2017 |

* cited by examiner

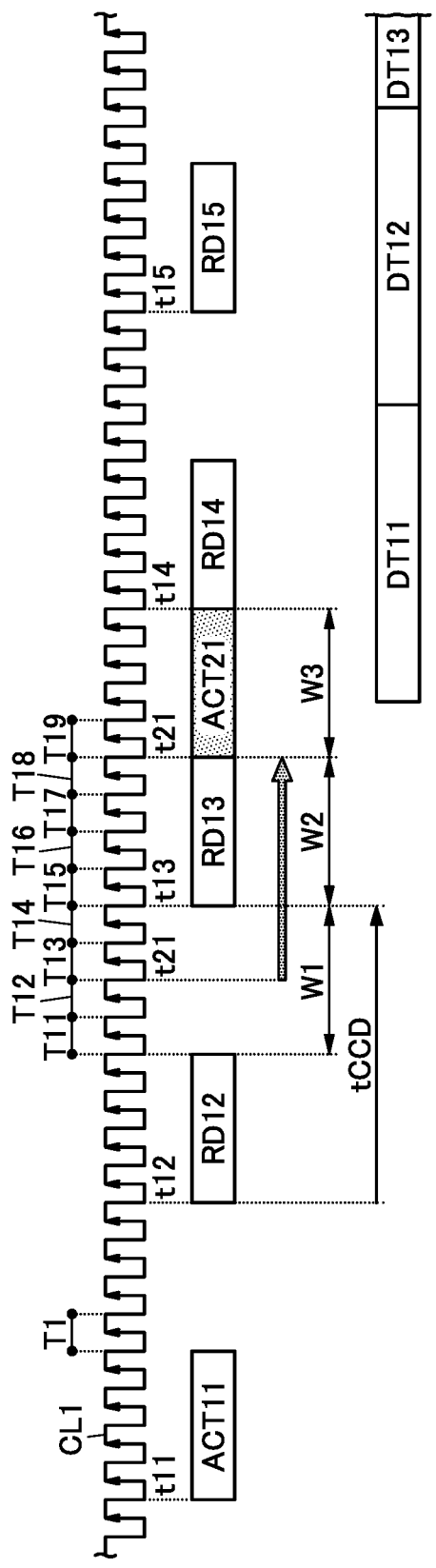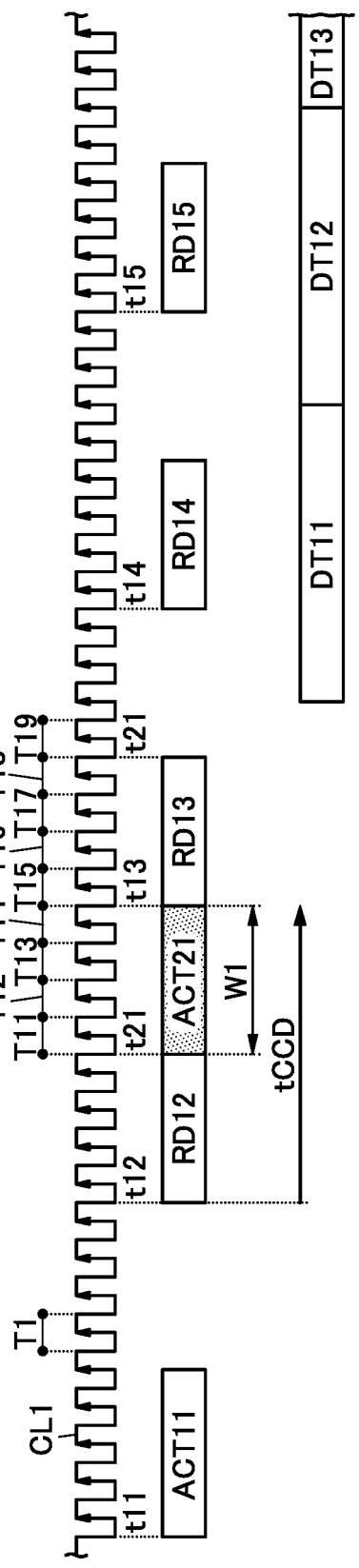

MITIGATING INTERFERENCE BETWEEN COMMANDS FOR DIFFERENT ACCESS REQUESTS IN LPDDR4 MEMORY SYSTEM

CROSS-REFERENCE TO RELATED APPLICATIONS

This application is a U.S. continuation of International Patent Application No. PCT/JP2019/037077, filed on Sep. 20, 2019, which in turn claims the benefit of priority to Japanese Patent Application No. 2018-186028, filed on Sep. 28, 2018, the entire disclosures of which are hereby incorporated by reference.

TECHNICAL FIELD

The present disclosure generally relates to command control systems, vehicles, command control methods, and non-transitory computer-readable medium. The present disclosure specifically relates to a command control system for outputting a Row Address Strobe (RAS) command and a Column Address Strobe (CAS) command to a storage device, a vehicle equipped with the command control system, a command control method, and a non-transitory computer-readable medium.

BACKGROUND ART

Patent Literature 1 discloses memory controller compliant with the Low Power Double Data Rate 4 (LPDDR4) standard. The memory controller writes and reads data to and from memory in accordance with the LPDDR4 standard. According to the LPDDR4 standard, a 4-cycle time period (time period four times as long as the length of one cycle) is required to output one command of commands (an activate command, a write command, and a read command) from the memory controller to the memory. A 2-cycle time period (time period two times as long as the length of one cycle) is required to output a precharge command. The activate command and the precharge command are hereinafter referred to as RAS commands. The write command and the read command are referred to as CAS commands.

In the memory controller described in Patent Literature 1, in an interval (e.g., a 4-cycle time period) between two CAS commands whose output timings are set for an access request, an output timing of a RAS command for another access request may be set. In this case, the output timing of the RAS command may be set in a cycle (e.g., the second cycle) other than the first cycle of the 4-cycle time period between the two CAS commands. If so, the RAS command interferes with the latter one of the two CAS commands. Thus, when a command length is a length corresponding to a multiple of the length of one cycle, interference may occur between commands for different access requests.

CITATION LIST

Patent Literature

Patent Literature 1: JP 2017-97618 A

SUMMARY OF INVENTION

In view of the foregoing, it is an object of the present disclosure to provide a command control system configured to set an output timing of a RAS command and an output timing of a CAS command for access requests different from each other without interference between the RAS command and the CAS command, a vehicle equipped with the command control system, a command control method, and a non-transitory computer-readable medium.

A command control system according to one aspect of the present disclosure includes a setting section and an adjuster. The setting section is configured to receive a first access request and a second access request for access to a storage device. The setting section is configured to set an output timing of a first RAS command and an output timing of a first CAS command for the first access request in accordance with a clock signal at which a cycle is repeated. The setting section is configured to set an output timing of a second RAS command and an output timing of a second CAS command for the second access request in accordance with the clock signal at which the cycle is repeated. The adjuster is configured to adjust the output timing of the first CAS command and the output timing of the second RAS command. The second RAS command has a command length several times as long as a length of the cycle. The adjuster is configured to, when the output timing of the second RAS command is set in a first cycle time period which is the cycle starting from a reference time point, determine whether or not the second RAS command is output to the storage device in the first cycle time period in accordance with whether or not the output timing of the first CAS command is set in a second cycle time period constituted by a prescribed number of the cycles subsequent to the reference time point.

A vehicle according to one aspect of the present disclosure includes the command control system, and a vehicle body. The vehicle body is equipped with the command control system.

A command control method according to one aspect of the present disclosure includes a setting process and an adjustment process. The setting process includes receiving a first access request and a second access request for access to a storage device. The setting process includes setting an output timing of a first RAS command and an output timing of a first CAS command for the first access request in accordance with a clock signal at which a cycle is repeated. The setting process includes setting an output timing of a second RAS command and an output timing of a second CAS command for the second access request in accordance with the clock signal at which the cycle is repeated. The adjustment process includes adjusting the output timing of the first CAS command and the output timing of the second RAS command. The second RAS command has a command length several times as long as a length of the cycle. The adjustment process includes, when the output timing of the second RAS command is set in a first cycle time period starting from a reference time point, determining whether or not the second RAS command is output to the storage device in the first cycle time period in accordance with whether or not the output timing of the first CAS command is set in a second cycle time period constituted by a prescribed number of the cycles subsequent to the reference time point.

A non-transitory computer-readable medium according to one aspect of the present disclosure is a non-transitory computer-readable medium on which a program configured to cause at least one processor to execute the command control method is recorded.

BRIEF DESCRIPTION OF DRAWINGS

FIG. 2A is a view illustrating how an output timing of a command is set when priority is given to the first CAS command, and FIG. 2B is a view illustrating how the output timing of the command is set when a second RAS command and the first CAS command do not interfere with each other;

DESCRIPTION OF EMBODIMENTS

Embodiment

Figure 1:
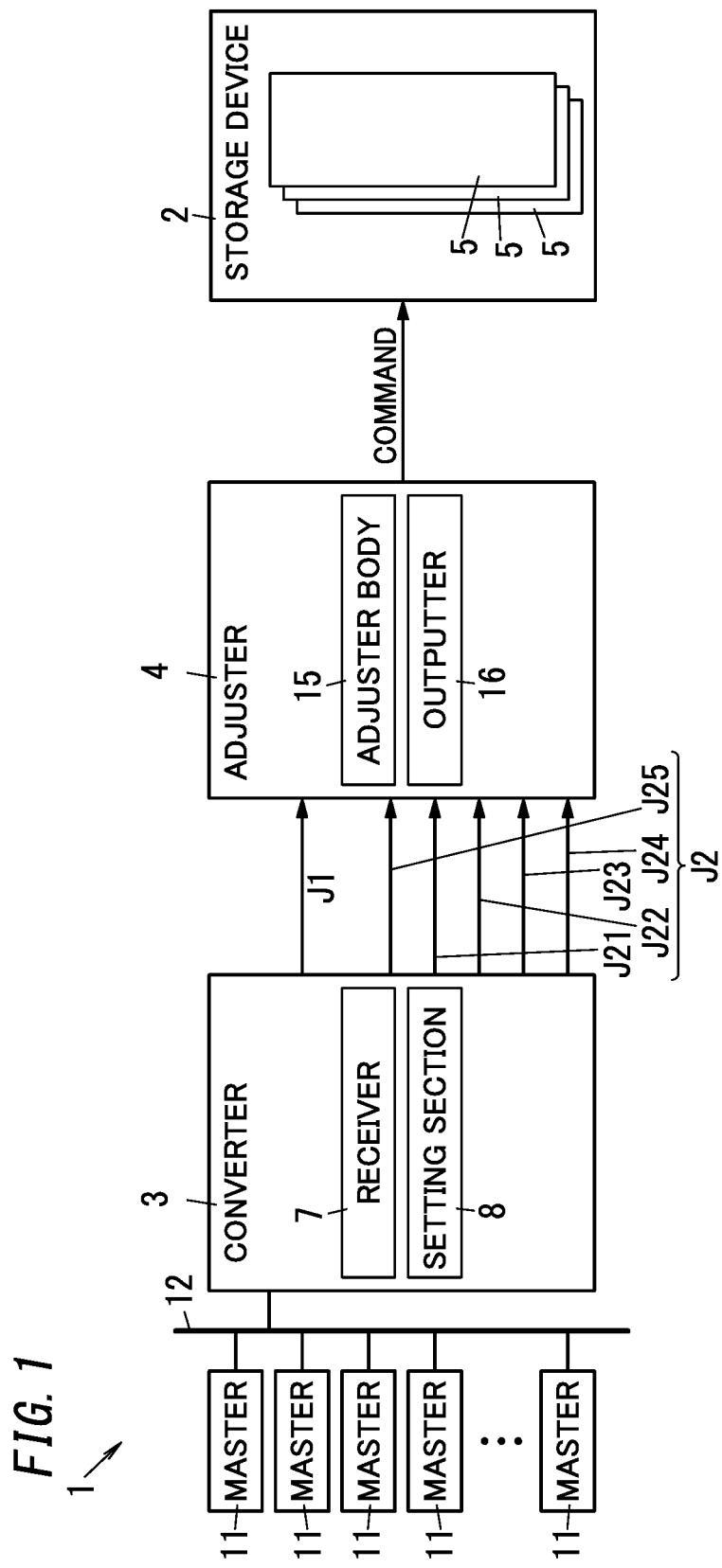
FIG. 1 is a view illustrating a configuration of a command control system according to the present embodiment.

As illustrated in FIG. 1, a command control system 1 according to the present embodiment is a system for outputting a command to a storage device 2 in accordance with an access request to write and read data to and from the storage device 2. The command used in the present embodiment is a command (i.e., multicycle command) having a command length that corresponds to a multiple of (e.g., four times as long as) the length of a cycle T1 (see FIG. 2A) of a clock signal CL1.

Note that in the present embodiment, the command length described above is four times as long as the length of the cycle T1 but is not limited to this example. The command length may be a length obtained by multiplying the length of the cycle T1 by any factor larger than or equal to two. The clock signal CL1 is a signal that defines a timing of operation of the command control system 1 and that repeats a prescribed cycle T1.

The command control system 1 is usable, for example, as a control device configured to control an in-vehicle storage device or a storage device of a personal digital assistant. Specifically, when controlling a storage device for a vehicle, the command control system 1 is usable as a control device configured to control a storage device used by a processor that processes detection values of various types of sensors mounted in the vehicle.

As illustrated in FIG. 1, the command control system 1 includes a storage device 2, a converter 3, and an adjuster 4. The storage device 2, the converter 3, and the adjuster 4 operate in synchrony with one another based on a clock signal.

The storage device 2 is a storage device configured to control reading and writing of data based on the commands. The storage device 2 includes a plurality of banks 5. The plurality of banks 5 are storage areas accessible at the same time (concurrently). As used herein, "access" refers to reading or writing data. The storage device 2 is, for example, a Dynamic Random Access Memory (DRAM) and may be a DRAM compliant with a (Low Power Double Data Rate 4 (LPDDR4) standard.

Each bank 5 has a bank number. Each bank 5 is identifiable by being specified by the bank number. Each bank 5 includes a plurality of memory cells. The memory cells are storage elements that store data. The plurality of memory cells are arranged in a matrix memory cell arrangement. Each memory cell is identifiable by being specified by a row and a column in the memory cell arrangement.

The converter 3 is configured to receive an access request from an external element and convert the access request into a command for controlling the storage device 2. That is, the converter 3 sets a command for the access request thus received. Specifically, the converter 3 sets, for the access request thus received, output timings of a series of commands required to execute the access request. The output timings of the series of commands are timings for outputting the commands from the adjuster 4 to the storage device 2 and correspond to locations of front ends of the commands (i.e., locations of output start time points of the commands) on clock signals.

The converter 3 includes a receiver 7 and a setting section 8.

The receiver 7 is a circuit for receiving an access request from an external element. The receiver 7 is connected to one or more (in FIG. 1, a plurality of) masters 11 via a bus 12. The receiver 7 receives access requests from the plurality of masters 11 via the bus 12. Each access request is a read request or a write request. The read request is a request that gives an instruction of reading data from the storage device 2. The write request is a request that gives an instruction of writing data to the storage device 2.

The master 11 is, for example, a processor, such as a Central Processing Unit (CPU) for controlling external devices or a process circuit (e.g., a video process circuit) for performing various types of processes.

The access request includes various types of information. Examples of the various types of information include bank number information, information on a row address and a column address, a transfer size, and priority degree information. Alternatively, examples of the various types of information include logical address information and a transfer size, which may be converted by the converter 3 into, for example, the bank number information, the information on the row address and the column address, and the priority degree information. The bank number information is the bank number of a bank 5 as a target of the access request. The information on the row address and the column address is information on a row address and a column address of a memory cell as a target of the access request. Note that when the access request is a write request, the master 11 transmits data to be written to the storage device 2 together with the access request. The priority degree information is information indicating a priority degree when the access request is executed. The transfer size is information representing the size of data to be written to or read from the storage device 2. When receiving a plurality of access requests, the converter 3 processes the access requests in a descending order of the priority degree.

The setting section 8 sets, for the access request received by the receiver 7, output timings of a series of commands for executing the access request, for each bank 5 in accordance with the various types of information included in the access request.

The series of commands are, for example, a Row Address Strobe (RAS) command and a Column Address Strobe (CAS) command in the case of a DRAM. The RAS command is a general term representing an activate command and a precharge command. The CAS command is general term representing a write command and a read command. The activate command is a command for opening a bank 5 to be accessed in the storage device 2. The precharge command is a command for closing the bank 5 accessed in the storage device 2. The write command is a command for giving an instruction of writing data to the storage device 2. The read command is a command for giving an instruction of reading data from the storage device 2.

Note that when the storage device 2 is a DRAM, a predetermined interval (e.g., 8-cycle time period which is a time period eight times as long as the length of one cycle T1) is secured for output timings of commands which are adjacent to each other in time series and which are output to an identical bank 5 in accordance with the specification of the DRAM. However, since no specification is defined between an output timing of the RAS command and an output timing of the CAS command which are output to different banks 5, the output timings of the commands set for the different banks 5 may cause interference with each other. In order to adjust the interference, the adjuster 4 is provided.

The adjuster 4 is a circuit for adjusting the output timings set by the setting section 8 and outputting the commands to the storage device 2 at the output timings thus adjusted. Note that, "adjusting" refers to giving priority levels to output timings of two commands interfering with each other so that the output timings no longer interfere with each other.

The adjuster 4 includes an adjuster body 15 and an outputter 16.

The adjuster body 15 is a circuit for adjusting the output timings set by the setting section 8. Specifically, two access requests for accessing different banks 5 are a first access request and a second access request. When setting of the output timings in the setting section 8 results in interference between the output timing of a command (e.g., CAS command) for the first access request and the output timing of a command (e.g., RAS command) for the second access request, the adjuster body 15 adjusts the output timings of the commands.

More specifically, for the adjustment described above, the adjuster body 15 gives priority to the output timing of the CAS command over the timing of the RAS command. That is, the adjuster body 15 changes the output timing of the RAS command to a cycle T1 at or after the output end time point of the CAS command (e.g., a cycle T1 starting from the output end time point) without changing the output timing of the CAS command.

The outputter 16 outputs the commands to the storage device 2 at the output timings set by the setting section 8. Note that the outputter 16 outputs, to the storage device 2, the command, whose output timing has been adjusted by the adjuster body 15, at the adjusted output timing. When outputting the commands to the storage device 2, the outputter 16 outputs, to the storage device 2, the commands in a command length (e.g., 4-cycle time period) predetermined depending on the types of the commands.

Note that the converter 3 and the adjuster 4 include, for example, a microcomputer (computer system) including a CPU and memory as main components. In other words, the converter 3 and the adjuster 4 are realized by a computer including the CPU and the memory, and the CPU executes a program stored in the memory, thereby causing the computer to function as the converter 3 and the adjuster 4. The program is stored in the memory in advance. However, the program may be provided over a telecommunications network such as the Internet, or as a recording medium such as a memory card storing the program therein.

With reference to FIGS. 2A and 2B, a process performed by each of the setting section 8 and the adjuster 4 will be described in detail.

FIG. 2A shows a state where output timings t11, t12, . . . of a series of commands (an activate command ACT11, a mid command RD12, . . . , and a read command RD15) for executing a first access request are set. FIG. 2A also shows a state where an output timing t21 of a leading command (an activate command ACT21) of a series of commands for executing a second access request is set.

Note that the output timings t11, t12, . . . respectively of the commands ACT11, RD12, . . . correspond to locations of, for example, front ends of the commands ACT11, RD12, . . . on the clock signal CL1 and are each set, for example, to a starting time point of one cycle T1. Note that in the present embodiment, the output timing is set to the starting time point of the one cycle T1 but may be set to an end time point or an intermediate time point.

The first access request and the second access request are access requests for accessing different banks 5. The first access request and the second access request are, for example, read requests. A series of commands for executing the first access request are the activate command ACT11 and the plurality of (e.g., four) read commands RD12, RD13, RD14, and RD15. The output timings t11, t12, . . . respectively of the commands ACT11, RD12, . . . are aligned in this order with intervals therebetween. In the case of the LPDDR4, an interval tCCD between the output timings t12 and t13 of adjacent two read commands (e.g., the read commands RD12 and RD13) is, for example, an 8-cycle time period. Each of the activate command ACT11 and the read commands RD12 to RD15 has a command length which is a length corresponding to a 4-cycle time period (time period which is four times as long as the length of one cycle T1). Thus, the interval W1 from the output end time point of the read command (e.g., RD12) to the output start time point of a next read command. (e.g., RD13) has a length corresponding to the 4-cycle time period.

In FIG. 2A, it is assumed that the output timing t21 of the activate command ACT21 is set, by the setting section 8, to the starting time point of any one cycle (e.g., third cycle T13) from the second to fourth cycles T12 to T14 of four cycles T11 to T14 within the interval W1 counted in order in time series. In this case, since the command length of the activate command ACT21 corresponds to the 4-cycle time period, the active command ACT21 interferes with the read command RD13 following the activation command ACT21. Therefore, in this case, the output timing t21 of the activate command ACT21 is changed by the adjuster body 15 to a starting time point of a cycle T19 starting from the output end time point of the read command RD13. In this way, the activate command ACT21 exactly fits in an interval W3 between the two read commands RD13 and RD14 and interferes with none of the two read commands RD13 and RD14. Thus, the output timing t13 of the read command RD13 is not delayed.

Note that in FIG. 2A, the cycles T11, T12, . . . are cycles corresponding to cycles T1 distinguished from each other based on their starting time points.

Moreover, when the output timing t21 of the activate command ACT21 is set by the setting section 8 to the starting time point of the cycle T11 which is the first cycle within the interval W1, the activate command ACT21 exactly fits in the interval W1 as shown in FIG. 2B and does not interfere with the read command RD13 following the active command ACT21. Therefore, in this case, the output timing t21 of the activate command ACT21 is not changed and is set to the starting time point of the first cycle T11.

Moreover, a time period W2 is a time period from the output start time point (output timing) t13 to the output end time point of any one read command (e.g., RD13) of the plurality of read commands RD11 to RD14. When the output timing t21 of the activate command ACT21 is set to a starting time point of any one cycle (e.g., T16) of four cycles T15 to T18 within the time period W2, the output timing t21 interferes with the read command RD13. Therefore, in this case, as illustrated in FIG. 2A, the output timing t21 is changed from the cycle T16 to a starting time point of the cycle T19 starting from the output end time point of the read command RD13.

The outputter 16 of the adjuster 4 outputs each command in a predetermined command length to the storage device 2 at the output timing set by the setting section 8. At this time, the outputter 16 outputs, to the storage device 2, the command, whose output timing has been changed by the adjuster body 15, at the output timing changed by the adjuster body 15.

As described above, if setting of the output timing by the setting section 8 results in interference between the activate command ACT21 and the read command RD13, priority is given to the output timing t13 of the read command. RD13 over the output timing t21 of the activate command ACT21. That is, the output timing t13 of the read command RD13 is not changed, but the output timing t21 of the activate command ACT21 is changed to the cycle T19 starting from the output end time point of the read command RD13. This reduces the occurrence of an interval (also referred to as a bubble) between pieces of data DT11, DT12, . . . (see FIG. 2A) read by the read command DR11, RD12, . . . included in the series of commands for the first access request. Note that the pieces of data DT11, DT12, . . . are pieces of data respectively read by the read commands RD11, RD12, . . . .

Note that the examples in FIGS. 2A and 2B show a case where the activate command ACT21 and the read command RD13 interfere with each other, wherein the activate command ACT21 is an example of the RAS command, the read command RD13 is an example of the CAS command. In the present embodiment, when the RAS command and the CAS command interfere with each other, priority is given to the output timing of the CAS command over the output timing of the RAS command. That is, the output timing of the RAS command is changed from the cycle T1 set by the setting section 8 to the cycle T1 starting from the output end time point of the output timing of the CAS command.

With reference to FIG. 1, the process performed by the setting section 8 to realize operation described with reference to FIGS. 2A and 2B will be described in detail.

As described above, the setting section 8 sets, for each bank 5, output timings of a series of commands output to each bank 5. In the following description, it is assumed, for example, that output timings of a series of commands for the first access request are set, and then, output timings of a series of commands for the second access request are set. The first access request and the second access request are access requests for accessing different banks 5. A RAS command and a CAS command included in the series of commands for the first access request are also respectively referred to as a first RAS command and a first CAS command. A RAS command and a CAS command included in the series of commands for the second access request are also respectively referred to as a second RAS command and a second CAS command.

As illustrated in FIG. 1, the setting section 8 outputs, to the adjuster 4, first information J1 and second information J2 for each cycle T1 of the clock signal CL1. The setting section 8 outputs the first information J1 and the second information J2 to the adjuster 4 by, for example, parallel transmission.

The first information J1 is information regarding the output timing of the second RAS command. Specifically, the first information J1 is information representing whether or not the output timing of the second RAS command is set to the cycle T1 (first cycle time period) starting from the present time point (reference time point). The second information J2 is information regarding the output time period of the first CAS command.

Note that the information regarding the output time period of the first CAS command also includes information regarding the output timing of the first CAS command. Specifically, the second information J2 is information representing whether or not part of the output time period of the first CAS command is set to each of a prescribed number of successive cycles T1 following the present time point (reference time point). Note that the "present time point" refers to a time point at which the setting section 8 is performing the process. Note that the setting section 8 operates in synchrony with, for example, the starting time point of each cycle T1 of the clock signal CL1. The output time period of the first CAS command is a time period from the output start time point to the output end time point of the first CAS command. A start of the output time period is the output timing.

Note that the setting section 8 generates the first information J1 based on the output timing of the second RAS command set by the setting section 8 and the command length of the second RAS command. The setting section 8 also generates the second information J2 based on the output timing of the first CAS command set by the setting section 8 and the command length of the first CAS command.

The "prescribed number" of the prescribed number of cycles T1 is, for example, a number larger by one than a value obtained by dividing a maximum length of the command length of the second RAS command by the cycle T1. Specifically, in the present embodiment, the command length of the second RAS command corresponds to the 4-cycle time period (time period four times as long as the length of one cycle T1), and therefore, the prescribed number is five. Thus, the second information J2 is information representing whether or not the output time period of the first CAS command is set to each of five successive cycles T1 subsequent to the present time point.

The second information J2 includes five pieces of information (first generation information J21 to fifth generation information J25). The five pieces of information J21 to 25 are, for example, output from the setting section 8 to the converter 3 by parallel transmission. The first generation information J21 is information representing whether or not part of the output time period of the first CAS command is set to the first cycle (i.e., cycle starting from the present time point) T1 of the five cycles T1. Similarly, the second generation information J22, the third generation information J23, the fourth generation information J24, and the fifth generation information J25 are pieces of information representing whether or not part of the output time period of the first CAS command is set respectively to the second, third, fourth, and fifth cycles T1.

A start of the output time period of the first CAS command represents the output timing of the first CAS command. Thus, to which number of cycle T1 the output timing of the first CAS command is set can be seen from the ordinal number of cycle T1 which is one of the first to fifth cycles T1 and to which the start of the output time period of the first CAS command is set.

TABLE 1

|     |     | T11 | T12 | T13 | T14 | T15 |
|-----|-----|-----|-----|-----|-----|-----|
| J1  |     | NOP | NOP | ACT | NOP | NOP |
| J2  | J21 | NOP | NOP | NOP | NOP | RD  |
|     | J22 | NOP | NOP | NOP | RD  | RD  |
|     | J23 | NOP | NOP | RD  | RD  | RD  |
|     | J24 | NOP | RD  | RD  | RD  | RD  |
|     | J25 | RD  | RD  | RD  | RD  | NOP |

Table 1 shows an example of the first information J1 and the second information J2. Specifically, Table 1 shows an example of the first information J1 and the second information J2 when (the starting time point of) each of the five cycles T11 to T15 in FIG. 2A is the present time point. In Table 1, T11 to T15 in an uppermost row represent cycles of the present time point. The cycles of the present time point are cycles of time points at which the adjuster body 15 is performing the process. The cycles of the present time point are the cycles starting from the present time point. A row (second row) under the row of the cycles T11 to T15 shows contents of the first information J1 to be output from the setting section 8 to the adjuster 4 at the cycle T1 of the present time point. Rows (third to seventh rows) under the first information J1 show contents (i.e., contents of the first generation information J21 to the fifth generation information J25) of the second information J2 to be output from the setting section 8 to the adjuster 4 in the cycle T1 of the present time point.

In the second row in Table 1 (the row representing the contents of the first information J1), "NOP" shows that the output timing of the RAS command is not set. "ACT" shows that the output timing of the activate command (i.e., the second RAS command) is set. In each of the third to seventh rows in Table 1, "NOP" shows that the output time period of the CAS command is not set. "RD" shows that the output time period of the read command (i.e., the first CAS command) is set. In each row (each row of the third to seventh rows) representing the content of the second information J2 in Table 1, "RD" in a row under "NOP" represents the start of the output time period of the read command and represents an output timing (output start time point) of the road command. Moreover, "RD" in the row above "NOP" represents the end of the output time period of the mad command and represents an output end time point of the read command.

As illustrated in Table 1, when the present time point is, for example, (the starting time point of) the cycle T11, a content of the first information J1 output from the setting section 8 to the adjuster 4 is "NOP", and contents of the second information J2 are "NOP" for the first generation information J21 to the fourth generation information J24 and "RD" for the fifth generation information J25. In this case, from the content of the first information J1, it can be seen that the output timing of the second RAS command is not set in the cycle T11. From the contents of the first generation information J21 to fifth generation information J25 of the second information J2, it can be seen that part of the output time period of the CAS command is set in none of the first to fourth cycles T11 to T14 counted from the cycle T11 of the present time point, and the start of the output time period (i.e., the output timing) of the read command is set in the fifth cycle T15.

Next, the process performed by the adjuster 4 to realize operation described in FIGS. 2A and 2B will be described. In the following description, the first cycle time period is a cycle T1 starting from the present time point. The second cycle time period is constituted by a prescribed number of (e.g., five) cycles T1 subsequent to the present time point. The third cycle time period is a cycle T1 which is included in the second cycle time period and in which the output timing of the first CAS command is set. For example, in FIG. 2A, when the cycle T11 is the first cycle time period, the second cycle time period includes five cycles T11 to T15. When the output timing (e.g., t13) of the first CAS command (e.g., RD13) is set in the cycle T15, the cycle T15 is the third cycle time period.

The adjuster body 15 of the adjuster 4 adjusts, based on the first information J1 and the second information J2 output from the setting section 8, the output timing of the first CAS command and the output timing of the second RAS command. At this time, the adjuster body 15 obtains, from the second information J2, information regarding a location of the third cycle time period in the second cycle time period, and based on the location, the adjuster body 15 determines whether or not the second RAS command is output to the storage device 2 in the first cycle time period. Then, the outputter 16 of the adjuster 4 outputs, based on the output timing of the command after the adjustment, a series of commands for the first access request and a series of commands for the second access request to the storage device 2.

Note that the adjuster 4 is configured to use the information regarding the location of the third cycle time period in the second cycle time period as described above to know the number of cycles T1 from the first cycle time period to the third cycle time period. This enables the adjuster 4 to execute optimal adjustment (e.g., adjustment with priority given to the CAS command), and thus, it is possible to output the second RAS command to the storage device 2 without delaying the output timing of the first CAS command following the second RAS command.

Note that "output timing of the command after adjustment" refers to an output timing adjusted by the adjuster 4 for a command whose output timing is adjusted by the adjuster 4 and an output timing set by the setting section 8 for a command whose output timing is not adjusted by the adjuster 4.

Figure 3:
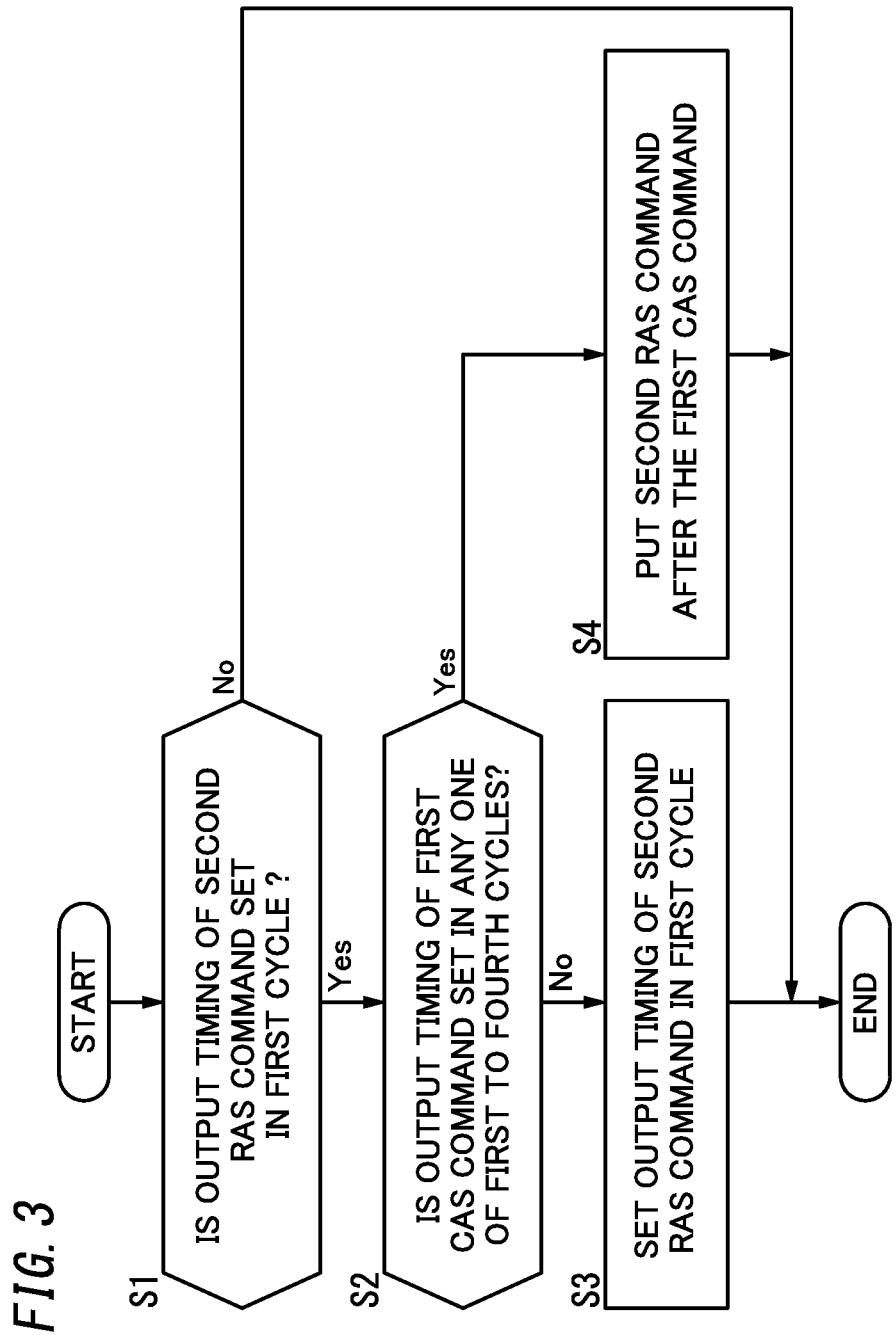
FIG. 3 is a flowchart illustrating operation of an adjuster body.

Specifically, the adjuster body 15 performs the adjustment in each cycle T1 according to a flowchart shown in FIG. 3. The flowchart in FIG. 3 shows processes executed in the cycle T1 of the present time point. As illustrated in FIG. 3, the adjuster body 15 determines, based on the first information J1, whether or not the output timing of the second RAS command is set in the cycle T1 (first cycle time period) starting from the present time point (S1). As a result of the determination, if the output timing of the second RAS command is not set (S1: No), the adjuster body 15 does not perform the adjustment, and the process performed by the adjuster body 15 ends. In this case, the outputter 16 outputs, at the output timing set by the setting section 8, a command for the first access request to the storage device 2. Note that the result of the determination in step S1 is negative (No) when the content of the first information J1 is NOP. That is, the result of the determination is negative in the case of the cycles T11, T12, T14, and T15 in Table 1.

On the other hand, if the result of the determination in step S1 is that the output timing of the second RAS command is set (S1: Yes), the process performed by the adjuster body 15 proceeds to step S2. As described above, the result of the determination in step S1 is positive (Yes) when the content of the first information J1 is, for example, "ACT" (in the case of the cycle T13 in Table 1).

In step S2, the adjuster body 15 determines, based on the second information J2, whether or not the output timing of the first CAS command is set in any one cycle T1 of four cycles T1 up to the fourth cycle T1 counted from a cycle T1 (first cycle time period) of the present time point of the second cycle time period constituted by a prescribed number of (e.g., five) cycles T1 subsequent to the present time point. If a result of the determination is negative (S2: No), the process performed by the adjuster body 15 proceeds to step S3.

In step S3, the adjuster body 15 sets, in accordance with the output timing set by the setting section 8, the output timing t21 of the second RAS command to the starting time point of the first cycle T1 (first cycle time period). In this way, the second RAS command is output in the first cycle time period. In this case, in each of the four cycles T1 up to the fourth cycle counted from the first cycle, the output time period of the first CAS command is not set. Thus, even if the output timing of the second RAS command is set in the first cycle time period (first cycle T1), the second RAS command and the first CAS command do not interfere with each other because the command length of the second RAS command corresponds to the 4-cycle time period. Therefore, the output timing of the second RAS command is set in the first cycle T1. Then, the process performed by the adjuster body 15 ends. In this case, the adjuster body 15 does not perform the adjustment, and therefore, the outputter 16 outputs, to the storage device 2, a command for the second access request at the output timing set by the setting section 8.

Note that the result of the determination in step S2 is negative (No) when the content of the second information J2 is, for example, the second information J2 of the cycle T11 in Table 1. This is a case shown in, for example, FIG. 2B. As illustrated in FIG. 2B, when the cycle T11 is the first cycle time period, the five cycles T11 to T15 constitute the second cycle time period. The output timing of the first CAS command is set (i.e., part of the output time period of the first CAS command is set) in none of the four, first to fourth, cycles T11 to T14 in the second cycle time period. Therefore, in this case, the process in step S3 is performed to set the output timing (e.g., t21) of the second RAS command (e.g., ACT21) in the first cycle T11 (first cycle time period).

On the other hand, if the result of the determination in step S2 is positive (S2: Yes), that is, if the second RAS command and a first CAS command following the second RAS command interfere with each other, the process performed by the adjuster body 15 proceeds to step S4. In step S4, the adjuster body 15 puts the second RAS command after the first CAS command. That is, the adjuster body 15 does not change the output timing of the first CAS command but changes the output timing of the second RAS command to the starting time point of the cycle T1 (fourth cycle time period) starting from the output end time point of the first CAS command.

Note that the result of the determination in step S2 is positive (Yes) when the contents of the second information J2 are, for example, similar to the contents of the second information J2 of any of the cycles T12 to T15 in Table 1. For example, the case of the cycle T13 in Table 1 is, for example, the case of FIG. 2A. As illustrated in FIG. 2A, when the cycle T13 is the first cycle time period, the five cycles T13 to T17 constitute the second cycle time period. The output timing of the first CAS command is set in the third cycle T15 in the second cycle time period. That is, the output time period of the first CAS command is set in the third to fifth cycles T15 to T17 in the second cycle time period. Thus, in this case, the process in step S4 is performed. Thus, the output timing (e.g., t21) of the second RAS command (e.g., ACT21) is changed from the first cycle time period T13 to the cycle T19 starting from the output end time point of the first CAS command (e.g., RD13).

Thus, it is possible to suppress a delay of the output timing (e.g., t13) of the first CAS command (e.g., RD13) due to the second RAS command (e.g., ACT21). Then, the process performed by the adjuster body 15 ends. In this case, the outputter 16 outputs each command to the storage device 2 at the output timing of the command after the adjustment.

As described above, if the output timing t21 of the second RAS command (e.g., ACT21) is set in the cycle T1 (first cycle time period) starting from the present time point (S1: Yes), the adjuster body 15 determines whether or not the output time period of the first CAS command is set in the predetermined number of cycles T1 (second cycle time period) subsequent to the present time point (S2). Then, the adjuster body 15 determines, based on the result of the determination, whether or not the second RAS command is output to the storage device 2 in the first cycle time period (S3, S4). Therefore, even if the command length of the second RAS command corresponds to a length that is a multiple of the length of the cycle T1, the adjuster body 15 can perform an optimal command adjustment such that the second RAS command and the first CAS command do not interfere each other. That is, it is possible to set the output timing of the second RAS command and the output timing of the first CAS command for different access requests without interference therebetween.

Variation

The embodiment is a mere example of various embodiments of the present disclosure. Various modifications are possible depending on design and the like as long as the object of the present disclosure can be achieved. Moreover, an aspect according to the above-described embodiment does not necessarily have to be implemented as the command control system 1. The aspect may be embodied, for example, as a vehicle equipped with the command control system 1, a command control method, and a program.

Note that the vehicle includes the command control system; and a vehicle body equipped with the command control system.

Moreover, the command control method includes a setting process and an adjustment process. The setting process includes receiving a first access request and a second access request for access to a storage device 2. The setting process includes setting an output timing of a first RAS command and an output timing of a first CAS command for the first access request in accordance with a clock signal CL1 at which a cycle T1 is repeated. The setting process includes setting an output timing of a second RAS command and an output timing of a second CAS command for the second access request in accordance with the clock signal CL1 at which the cycle T1 is repeated. The adjustment process includes adjusting the output timing of the first CAS command and the output timing of the second RAS command. The second RAS command has a command length several times as long as the length of the cycle T1. The adjustment process includes, when the output timing of the second RAS command is set in a first cycle time period starting from a reference time point, determining whether or not the second RAS command is output to the storage device 2 in the first cycle time period in accordance with whether or not the output timing of the first CAS command is set in a second cycle time period constituted by a prescribed number of the cycles T1 subsequent to the reference time point.

The program is a program configured to cause at least one processor to execute the command control method.

Note that any of the variations to be described below may be combined as appropriate.

First Variation

In the embodiment, in step S2 in FIG. 3, it is determined whether or not the output timing of the first CAS command is set in "any one" cycle T1 of the cycles T1 up to the fourth cycle counted from the cycle (first cycle) T1 of the present time point. However, in step S2, it may be determined whether or not the output timing of the first CAS command is set in "at least one" cycle T1 of the cycles T1 up to the fourth cycle counted from the first cycle time period (first cycle T1). In this case, if a result of the determination is positive (S2: Yes), the output timing of the second RAS command is changed from the first cycle time period to the fourth cycle time period in step S4. The fourth cycle time period is a cycle T1 starting from an output end time point of the first CAS command whose output timing is set in the last cycle T1 of the at least one cycle T1.

Note that when the "at least one" cycle T1 includes only one cycle T1, the last cycle T1 means the one cycle T1, and when the "at least one" cycle T1 includes a plurality of cycles T1, the last cycle T1 means the last cycle of the plurality of cycles T1.

That is, when the "at least one" cycle T1 includes only one cycle T1, the operation of the present variation is the same as the operation in the flow chart of FIG. 3 of the first embodiment. When the "at least one" cycle T1 includes a plurality of cycles T1, the output timing of the first CAS command is set in a plurality of cycles T1 of the first to fourth cycles T1. That is, this is a case where a plurality of first CAS commands are set. In this case, the output timing of the second RAS command is put after the plurality of first CAS commands. That is, the output timing of the second RAS command is changed to a cycle T1 starting from an output end time point of the last first CAS command of the plurality of first CAS commands. The last cycle T1 refers to a cycle T1 in which the output timing of the last first CAS command is set.

Second Variation

In the embodiment, as illustrated in FIG. 2A, the adjuster 4 performs adjustment of giving priority to the read command RD when the output timing t13 of the read command RD13 (i.e., first CAS command) and the output timing t21 of the activate command ACT21 (i.e., second RAS command) are adjusted. That is, the adjuster 4 does not change the output timing t13 of the read command RD13 but changes the output timing t21 of the activate command ACT21 to the starting time point of the cycle T19 starting from the output end time point of the read command RD13.

Figure 4:
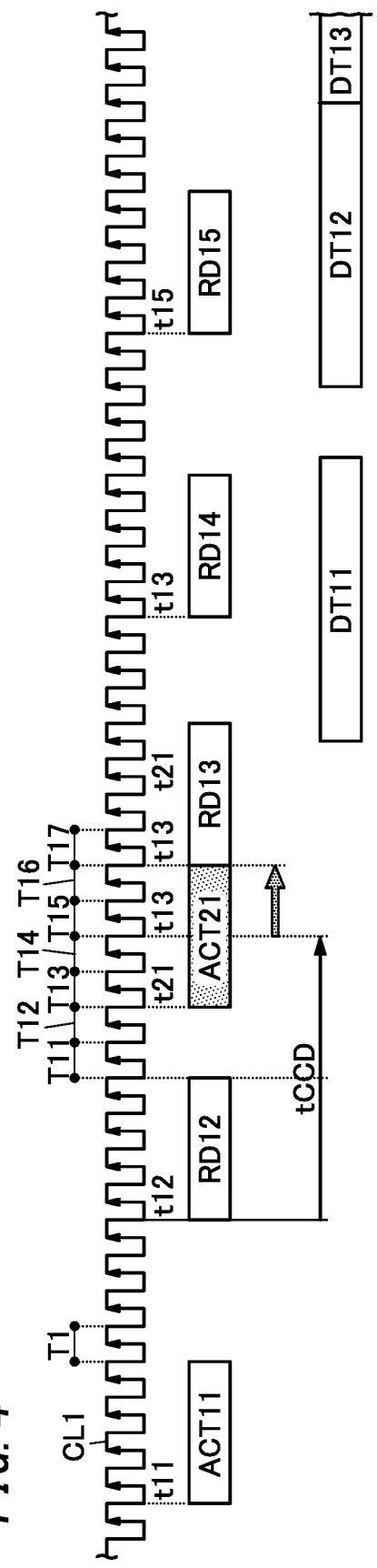
FIG. 4 is a view illustrating how an output timing of a command is set when priority is given to a second RAS command in a command control system according to a second variation.

In this variation, when the adjuster 4 adjusts the output timing t13 of the read command RD13 and the output timing t21 of the activate command ACT21, the adjuster 4 performs adjustment of giving priority to the activate command ACT21. That is, it is assumed that the setting section 8 sets the output timing of the active command ACT21 in the cycle T13 of the cycles T11 to T15 between the two read commands RD12 and RD13 and sets the output timing t13 of the read command RD13 in the cycle T15 (see FIG. 2A). In this case, as illustrated in FIG. 4, the adjuster 4 does not change the output timing t21 of the activate command ACT21 but changes the output timing t13 of the read command RD13 to a starting time point of the cycle T17 starting from the output end time point of the activate command ACT21.

Figure 5:
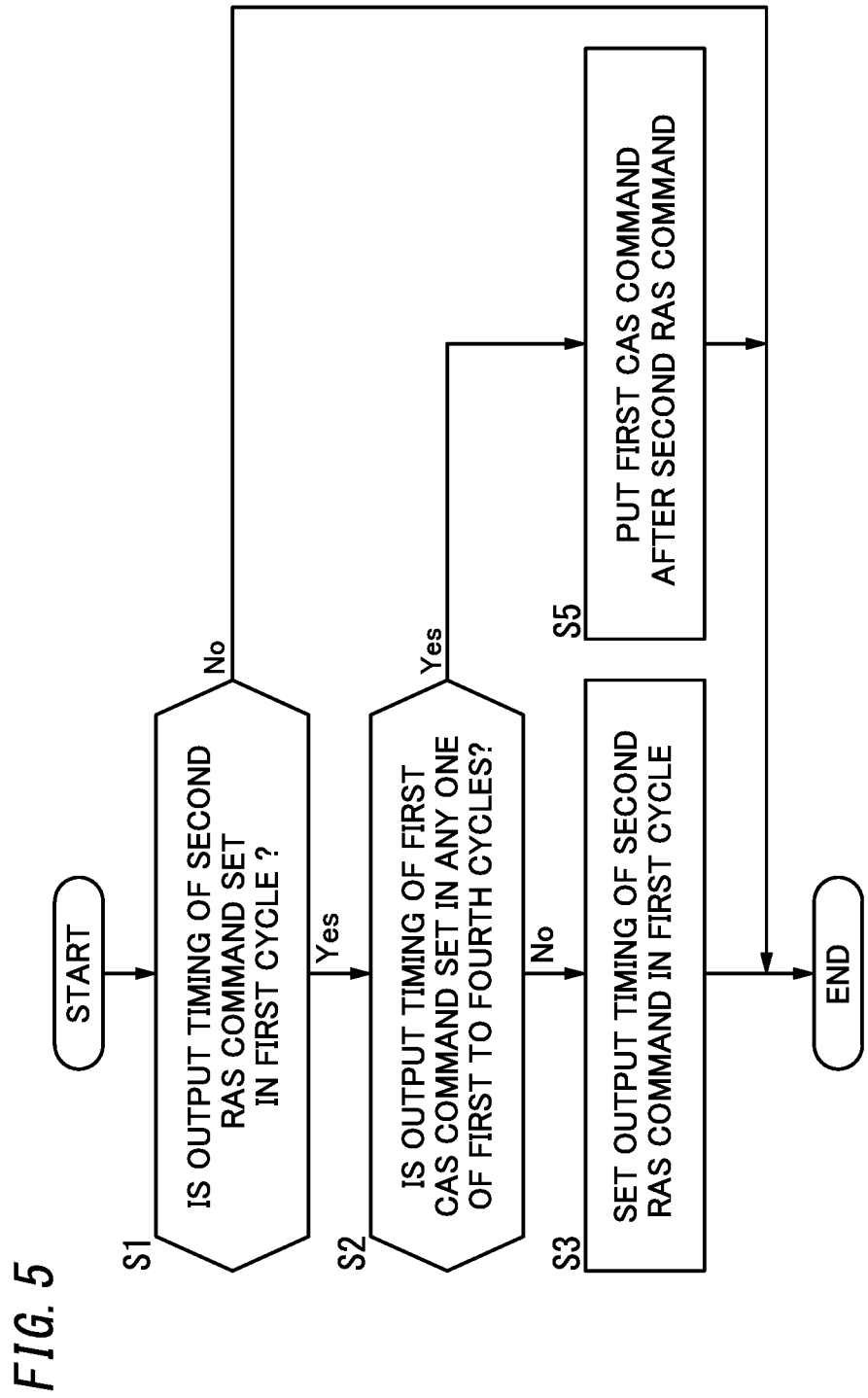
FIG. 5 is a flowchart illustrating operation of an adjuster body of the command control system according to the second variation.

More specifically, the adjuster body 15 performs the adjustment in each cycle T1 in accordance with a flowchart shown in FIG. 5. The flowchart in FIG. 5 shows processes executed in the cycle T1 of the present time point.

Of steps S1 to S3 and step S5 in FIG. 5, steps S1 to S3 are the same as steps S1 to S3 in FIG. 3, and thus, the description thereof is omitted, and step S5 will be described.

If a result of the determination in step S2 in FIG. 5 is positive (S2: Yes), that is, if the second RAS command and a first CAS command following the second RAS command interfere with each other, the process performed by the adjuster body 15 proceeds to step S5. In step S5, the adjuster body 15 puts the first CAS command after the second RAS command. That is, the adjuster body 15 does not change the output timing of the second RAS command but changes the output timing of the first CAS command from the starting time point of the cycle T1 set in the setting section 8 to the starting time point of a cycle T1 starting from the output end time point of the second RAS command.

Note that the result of the determination in step S2 is positive (Yes) when the contents of the second information J2 is, for example, similar to the contents of the second information J2 of any of the cycles T12 to T15 in Table 1. For example, the case of the cycle T13 in Table 1 is, for example, the case of FIG. 4. As illustrated in FIG. 4, when the cycle T13 is the first cycle time period, the five cycles T13 to T17 constitute the second cycle time period. The output time period of the first CAS command is set in the third to fifth cycles T15 to T17 in the second cycle time period. Thus, in this case, the process in step S5 is performed to change the output timing (e.g., t13) of the first CAS command (e.g., RD13) from the cycle T15 set by the setting section 8 to the cycle T17 starting from the output end time point of the second RAS command (e.g., ACT21).

This enables a delay of the output timing (e.g., t21) of the second RAS command (e.g., ACT21) to be reduced. That is, an optimal command adjustment can be made with priority given to the RAS command. Then, the process performed by the adjuster body 15 ends. In this case, the outputter 16 outputs each command to the storage device 2 at the output timing of the command after the adjustment.

Note that in this variation, in step S2, it is determined whether or not the output timing of the first CAS command is set in "any one" cycle T1 of the cycles T1 up to the fourth cycle counted from the cycle of the present time point (first cycle) T1. Then, if the result of the determination is positive (S2: Yes), the output timing of the first CAS command is changed to a cycle T1 starting from the output end time point of the second RAS command (S5).

In step S2, however, it may be determined whether or not the output timing of the first CAS command is set in "at least one" cycle T1 of cycles T1 up to the fourth cycle counted from the cycle T1 at the present time point. In this case, if the result of the determination is positive (S2: Yes), the output timing of the first CAS command set in the at least one cycle T1 is changed to a cycle T1 at or after the output end time point of the second RAS command in step S5.

Third Variation

Figure 6:
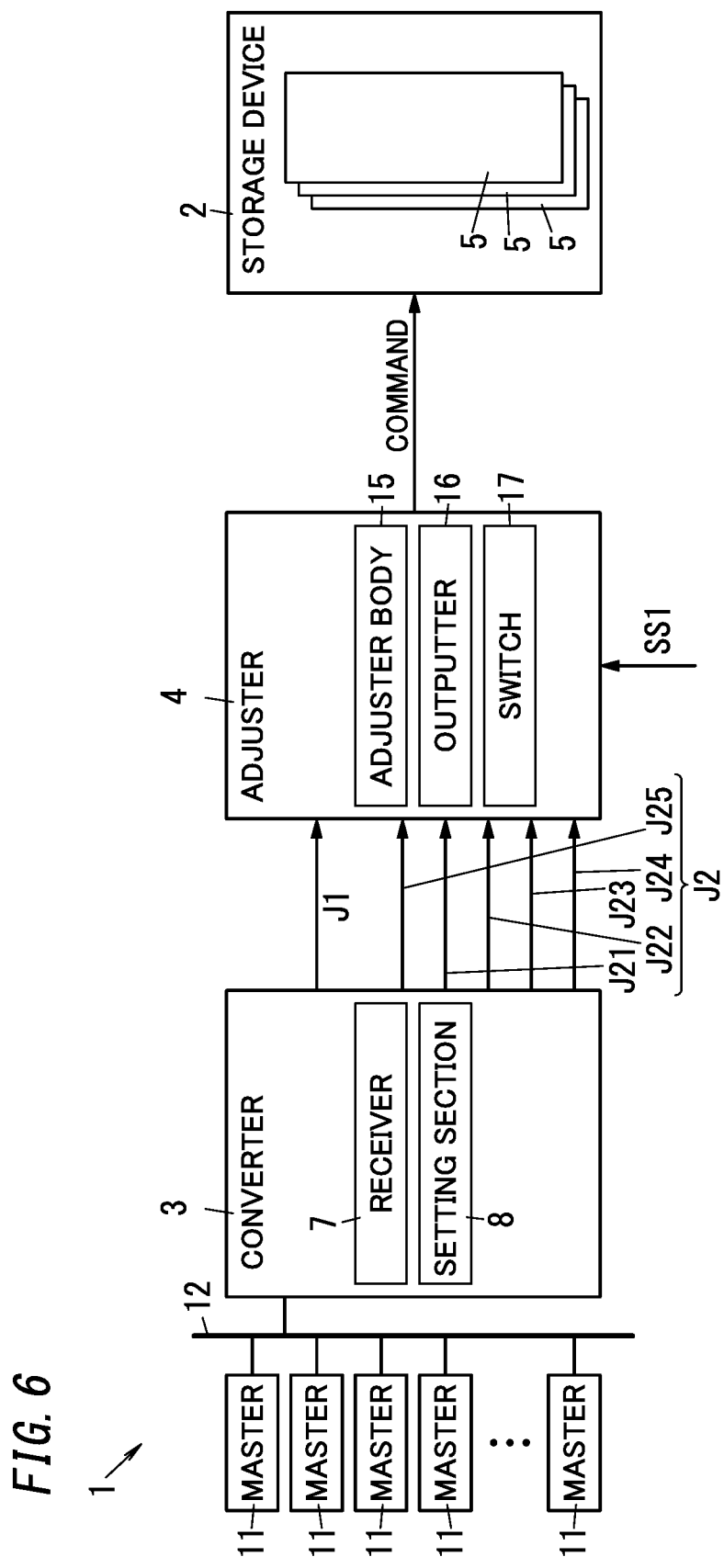
FIG. 6 is a view illustrating a configuration of a command control system according to a third variation.

In the embodiment above, the adjuster 4 may further include a switch 17 as illustrated in FIG. 6. The switch 17 selectively switches the adjustment process performed by the adjuster body 15 between a first priority mode and a second priority mode by a control signal SS1 received from an external element.

The first priority mode is a CAS priority mode. That is, in the first priority mode, the adjuster body 15 adjusts the output timing t13 of the first CAS command (e.g., RD13) and the output timing t21 of the second RAS command (e.g., ACT21) in a manner similar to the case of the embodiment (e.g., see FIG. 2A).

In the example shown in FIG. 2A, a read command RD13 is shown as an example of the first CAS command, and an activate command ACT21 is shown as an example of the second RAS command. The setting section 8 sets the output timing t21 of the activate command ACT21 to the starting time point of the cycle T13 and sets the output timing t13 of the read command RD13 to the cycle T15.

In this case, in the first priority mode, the adjuster body 15 does not change the output timing t13 of the read command RD13 but changes the output timing t21 of the activate command ACT21 from the cycle T13 set by the setting section 8 to a starting time point of the cycle T19 starting from the output end time point of the read command RD13. As described above, the activate command ACT21 (i.e., second RAS command) is put after the read command RD13 (i.e., first CAS command).

The second priority mode is a RAS priority mode. That is, in the second priority mode, the adjuster body 15 adjusts the output timing t13 of the first CAS command (e.g., RD13) and the output timing t21 of the second RAS command (e.g., ACT21) as shown in FIG. 4.

In the example shown in FIG. 4, a read command RD13 is shown as an example of the first CAS command and an activate command ACT21 is shown as an example of the second RAS command. The setting section 8 sets the output timing t21 of the activate command ACT21 to the starting time point of the cycle T13 and sets the output timing t13 of the read command RD13 to the cycle T15.

In this case, in the second priority mode, the adjuster body 15 does not change the output timing t21 of the activate command ACT21 but changes the output timing t13 of the read command RD13 from the starting time point of the cycle T15 set by the setting section 8 to the starting time point of the cycle T17 starting from the output end time point of the activate command ACT21. As described above, the read command RD13 (i.e., first CAS command) is put after the activate command ACT21 (i.e., second RAS command).

According to this variation, when the output timing (e.g., t13) of the first CAS command (e.g., RD13) and the output timing (e.g., t21) of the second RAS command (e.g., ACT21) are adjusted, it is possible to selectively switch priority between the output timing (e.g., t13) of the first CAS command (e.g., RD13) and the output timing (e.g., t21) of the second RAS command (e.g., ACT21).

SUMMARY

A command control system (1) according to a first aspect includes a setting section (8) and an adjuster (4). The setting section (8) is configured to receive a first access request and a second access request for access to a storage device (2). The setting section (8) is configured to set an output timing of a first RAS command (e.g., ACT11) and an output timing of a first CAS command (e.g., RD13) for the first access request in accordance with a clock signal (CL1) at which a cycle (T1) is repeated. The setting section (8) is configured to set an output timing of a second RAS command (e.g., ACT21) and an output timing of a second CAS command for the second access request in accordance with the clock signal (CL1) at which the cycle (T1) is repeated. The adjuster (4) is configured to adjust the output timing (e.g., t13) of the first CAS command (e.g., RD13) and the output timing (e.g., t21) of the second RAS command (e.g., ACT21). The second RAS command (e.g., ACT21) has a command length corresponding to a multiple of a length of the cycle (T1). The adjuster (4) is configured to, when the output timing (e.g., t21) of the second RAS command (e.g., ACT21) is set in a first cycle time period (e.g., T13) which is the cycle (T1) starting from a reference time point, determine whether or not the second RAS command (e.g., ACT21) is output to the storage device (2) in the first cycle time period (T13) in accordance with whether or not the output timing (e.g., t13) of the first CAS command (e.g., RD13) is set in a second cycle time period (e.g., T13 to T17) constituted by a prescribed number of the cycles (T1) subsequent to the reference time point.

With this configuration, when the output timing (e.g., t21) of the second RAS command (e.g., ACT21) is set in the first cycle time period (e.g., T13) which is the cycle (T1) starting from the reference time point, the adjuster (4) can determine whether or not the output timing (e.g., t13) of the first CAS command (e.g., RD13) is set in the second cycle time period (e.g., T13 to T17) which corresponds to the predetermined number of cycles (T1) subsequent to the reference time point. Thus, also when the second RAS command (e.g., ACT21) has a command length corresponding to a multiple as long as the length of the cycle (T1), it is possible to suppress the output timing (e.g., t13) of the first CAS command (e.g., RD13) output subsequently to the second RAS command (e.g., ACT21) from being delayed due to outputting of the second RAS command (e.g., ACT21).

In a command control system (1) according to a second aspect referring to the first aspect, the setting section (8) is configured to output a first information (J1) and a second information (J2) to the adjuster (4). The first information (J1) represents whether or not the output timing (e.g., t21) of the second RAS command (e.g., ACT21) is set in the first cycle time period (e.g., T11). The second information (J2) represents whether or not the output timing (e.g., t13) of the first CAS command (e.g., RD13) is set in the second cycle time period (e.g., T11 to T15).

This configuration enables the first information (J1) and the second information (J2) to be transmitted from the setting section (8) to the adjuster (4). The first information (J1) and the second information (J2) are pieces of information required by the adjuster (4) to determine whether or not the second RAS command (e.g., ACT21) is output in the first cycle time period (e.g., T11). Thus, the adjuster (4) can appropriately perform the above-described determination.

In a command control system (1) according to a third aspect referring to the first or second aspect, the prescribed number is a number larger by one than a value obtained by dividing a maximum length of the command length of the second RAS command (e.g., ACT21) by the length of the cycle (T1).

This configuration enables the adjuster (4) to make a determination as to whether or not the output timing (e.g., t13) of the first CAS command (e.g., RD13) is set for each cycle (T1) from the reference time point to the end of one cycle (T1) following cycles the number of which includes the maximum length of the command length of the second RAS command (e.g., ACT21).

In a command control system (1) according to a fourth aspect referring to any one of the first to third aspects, the cycle (T1) which is included in the second cycle time period (e.g., T11 to T15) and in which the output timing (e.g., t13) of the first CAS command (e.g., RD13) is set is a third cycle time period (e.g., T13). The adjuster (4) is configured to, when the output timing (e.g., t21) of the second RAS command (e.g., ACT21) is set in the first cycle time period (e.g., T11), determine whether or not the second RAS command (e.g., ACT21) is output to the storage device (2) in the first cycle time period (e.g., T11) based on a location of the third cycle time period (e.g., T13) in the second cycle time period (e.g., T11 to T15).

This configuration enables the adjuster (4) to exactly determine the number of cycles (T1) between the output timing (e.g., t21) of the second RAS command (e.g., ACT21) and the output timing (e.g., t13) of the first CAS command (e.g., RD13). Thus, it is possible to further suppress a delay of the output of the first CAS command (e.g., RD13) due to the output of the second RAS command (e.g., ACT21).

In a command control system (1) according to a fifth aspect referring to any one of the first to fourth aspects, the second RAS command (e.g., ACT21) has a command length m times as long as the length of the cycle (T1), where m is a natural number larger than or equal to two. The adjuster (4) is configured to, when the output timing (e.g., t21) of the second RAS command (e.g., ACT21) is set in the first cycle time period (e.g., T13) and the output timing (e.g., t13) of the first CAS command (e.g., RD13) is set in at least one cycle (T1) of the cycles (T1) up to an mth cycle (T1) counted from the reference time point in the second cycle time period (e.g., T13 to T17), change the output timing (e.g., t21) of the second RAS command (e.g., ACT21) from the first cycle time period (e.g., T13) to a fourth cycle time period (T19) which is a cycle (T1) starting from an output end time point of the first CAS command (e.g., RD13) whose output timing is set to a last cycle (T15) of the at least one cycle (T1).

With this configuration, when the output timing (e.g., t21) of the second RAS command (e.g., ACT21) and the output timing (e.g., t13) of the first CAS command (e.g., RD13) are adjusted, the output timing (e.g., t21) of the second RAS command (e.g., ACT21) and the output timing (e.g., t13) of the first CAS command (e.g., RD13) can be adjusted without delaying the output timing (e.g., t13) of the first CAS command (e.g., RD13).

In a command control system (1) according to a sixth aspect referring to any one of the first to fourth aspects, the second RAS command (e.g., ACT21) has a command length m times as long as the length of the cycle (T1), where m is a natural number larger than or equal to two. The adjuster (4) is configured to, when the output timing (e.g., t21) of the second RAS command (e.g., ACT21) is set in the first cycle time period (e.g., T13) and the output timing (e.g., t13) of the first CAS command (e.g., RD13) is set in at least one cycle (e.g., T13) of the cycles (e.g., T13 to T17) up to an mth cycle (T1) counted from the reference time point in the second cycle time period (e.g., T13 to T17), change the output timing (e.g., t13) of the first CAS command (e.g., RD13) set in the at least one cycle (e.g., T13) to a cycle (e.g., T17) at or after an output end time point of the second RAS command (e.g., ACT21).

With this configuration, when the output timing (e.g., t21) of the second RAS command (e.g., ACT21) and the output timing (e.g., t13) of the first CAS command (e.g., RD13) are adjusted, it is possible to adjust the output timing (e.g., t21) of the second RAS command (e.g., ACT21) and the output timing (e.g., t13) of the first CAS command (e.g., RD13) without delaying the output timing (e.g., t21) of the second RAS command (e.g., ACT21).

In a command control system (1) according to a seventh aspect referring to any one of the first to sixth aspects, the second RAS command (e.g., ACT21) has a command length m times as long as the length of the cycle (T1), where m is a natural number larger than or equal to two. The adjuster (4) is configured to, when the output timing (e.g., t21) of the second RAS command (e.g., ACT21) is set in the first cycle time period (e.g., T11) and the output timing (e.g., t13) of the first CAS command (e.g., RD13) is set in none of cycles (e.g., T11 to T14) up to an mth cycle counted from the reference time point in the second cycle time period (e.g., T11 to T15), output the second RAS command (e.g., ACT21) to the storage device (2) in the first cycle time period (e.g., T11).

This configuration enables the second RAS command (e.g., ACT21) to be output to the storage device (2) without delaying both the second RAS command (e.g., ACT21) and the first CAS command (e.g., RD13) output subsequently to the second RAS command.

In a command control system (1) according to an eighth aspect referring to any one of the first to seventh aspects, The adjuster (4) includes a switch (17) configured to selectively switch between a first priority mode and a second priority mode. In the first priority mode, when the adjuster (4) adjusts the output timing (e.g., t13) of the first CAS command (e.g., RD13) and the output timing (e.g., t21) of the second RAS command (e.g., ACT21), the adjuster (4) forgoes changing the output timing (e.g., t13) of the first CAS command (e.g., RD13) and changes the output timing (e.g., t21) of the second RAS command (e.g., ACT21) from the cycle (e.g., T13) set by the setting section (8) to the cycle (T19) starting from the output end time point of the first CAS command (e.g., RD13). In the second priority mode, when the adjuster (4) adjusts the output timing (e.g., t13) of the first CAS command (e.g., RD13) and the output timing (e.g., t21) of the second RAS command (e.g., ACT21), the adjuster (4) forgoes changing the output timing (e.g., t21) of the second RAS command (e.g., ACT21) and changes the output timing (e.g., t13) of the first CAS command (e.g., RD13) from the cycle (e.g., T15) set by the setting section (8) to the cycle (e.g., T17) starting from the output end time point of the second RAS command (e.g., ACT21).

With this configuration, when the output timing (e.g., t13) of the first CAS command (e.g., RD13) and the output timing (e.g., t21) of the second RAS command (e.g., ACT21) are adjusted, it is possible to selectively switch priority between the output timing (e.g., t13) of the first CAS command (e.g., RD13) and the output timing (e.g., t21) of the second RAS command (e.g., ACT21).

A vehicle of a ninth aspect includes the command control system (1) of any one of the first to eighth aspects, and a vehicle body. The vehicle body is equipped with the command control system.

With this configuration, it is possible to provide a vehicle equipped with the command control system (1).

An apparatus control method of a tenth aspect includes a setting process, and an adjustment process. The setting process includes receiving a first access request and a second access request for access to a storage device (2). The setting process includes setting an output timing of a first RAS command (e.g., ACT11) and a first CAS command (e.g., RD13) for the first access request in accordance with a clock signal (CL1) at which a cycle (T1) is repeated. The setting process includes setting an output timing of a second RAS command (e.g., ACT21) and an output timing of a second CAS command for the second access request. The adjustment process includes adjusting the output timing (e.g., t13) of the first CAS command (e.g., RD13) and the output timing (e.g., t21) of the second RAS command (e.g., ACT21). The second RAS command (e.g., ACT21) has a command length several times as long as a length of the cycle (T1). The adjustment process includes, when the output timing (e.g., t21) of the second RAS command (e.g., ACT21) is set in a first cycle time period (e.g., T13) starting from a reference time point, determining whether or not the second RAS command (e.g., ACT21) is output to the storage device (2) in the first cycle time period (e.g., T13) in accordance with whether or not the output timing (e.g., t13) of the first CAS command (e.g., RD13) is set in a second cycle time period (e.g., T13 to T17) constituted by a prescribed number of the cycles (T1) subsequent to the reference time point.

With this configuration, when the output timing (e.g., t21) of the second RAS command (e.g., ACT21) is set in a first cycle time period (e.g., T13) starting from a reference time point, the adjustment process can determine whether or not the output timing (e.g., t13) of the first CAS command (e.g., RD13) is set in the second cycle time period (e.g., T13 to T17) which corresponds to the predetermined number of cycles subsequent to the reference time point. Thus, also when the second RAS command (e.g., ACT21) has a command length corresponding to a multiple of the length of the cycle (T1), it is possible to suppress the output timing (e.g., t13) of the first CAS command (e.g., RD13) output from being delayed due to outputting of the second RAS command (e.g., ACT21).

A program of an eleventh aspect is a program configured to cause at least one processor to execute the command control method of the tenth aspect.

With this configuration, it is possible to provide a program configured to cause at least one processor to execute the command control method.

REFERENCE SIGNS LIST

1 COMMAND CONTROL SYSTEM
2 STORAGE DEVICE
4 ADJUSTER
8 SETTING SECTION
17 SWITCH
ACT11 ACTIVATE COMMAND (FIRST RAS COMMAND)
ACT21 ACTIVATE COMMAND (SECOND RAS COMMAND)
CL1 CLOCK SIGNAL
J1 FIRST INFORMATION
J2 SECOND INFORMATION
RD13 READ COMMAND (FIRST CAS COMMAND)
t21, t13 OUTPUT TIMING
T1, T13 to T17 CYCLE

The invention claimed is:

1. A command control system in LPDDR4, comprising:
a setting circuit configured to
receive a first access request and a second access request for access to a storage device, and
set an output timing of a first RAS command and an output timing of a first CAS command for the first access request and set an output timing of a second RAS command and an output timing of a second CAS command for the second access request in accordance with a clock signal at which a cycle is repeated; and
an adjuster circuit configured to adjust the output timing of the first CAS command and the output timing of the second RAS command,
the second RAS command having a command length corresponding to a multiple of a length of the cycle,
the adjuster circuit being configured to, when the output timing of the second RAS command is set in a first cycle time period which is the cycle starting from a reference time point, determine whether or not the second RAS command is output to the storage device in the first cycle time period in accordance with whether or not the output timing of the first CAS command is set in a second cycle time period constituted by a prescribed number of the cycles subsequent to the reference time point.

2. The command control system of claim 1, wherein
the setting circuit is configured to output, to the adjuster circuit,
first information representing whether or not the output timing of the second RAS command is set in the first cycle time period, and
second information representing whether or not the output timing of the first CAS command is set in the second cycle time period.

3. The command control system of claim 1, wherein
the prescribed number is a number larger by one than a value obtained by dividing by the length of the cycle a maximum length of the command length of the second RAS command.

4. The command control system of claim 1, wherein
the cycle which is in the second cycle time period and in which the output timing of the first CAS command is set is a third cycle time period, and
the adjuster circuit is configured to, when the output timing of the second RAS command is set in the first cycle time period, determine whether or not the second RAS command is output to the storage device in the first cycle time period based on a location of the third cycle time period in the second cycle time period.

5. The command control system of claim 1, wherein
the second RAS command has a command length m times as long as the length of the cycle, where m is a natural number larger than or equal to two, and
the adjuster circuit is configured to, when the output timing of the second RAS command is set in the first cycle time period and the output timing of the first CAS command is set in at least one cycle of the cycles up to an mth cycle counted from the reference time point in the second cycle time period, change the output timing of the second RAS command from the first cycle time period to a fourth cycle time period which is a cycle starting from an output end time point of the first CAS command whose output timing is set to a last cycle of the at least one cycle.

6. The command control system of claim 1, wherein
the second RAS command has a command length m times as long as the length of the cycle, where m is a natural number larger than or equal to two, and
the adjuster circuit is configured to, when the output timing of the second RAS command is set in the first cycle time period and the output timing of the first CAS command is set in at least one cycle of the cycles up to an mth cycle counted from the reference time point in the second cycle time period, change the output timing of the first CAS command set in the at least one cycle to a cycle at or after an output end time point of the second RAS command.

7. The command control system of according to claim 1, wherein
the second RAS command has a command length m times as long as the length of the cycle, where m is a natural number larger than or equal to two, and
the adjuster circuit is configured to, when the output timing of the second RAS command is set in the first cycle time period and the output timing of the first CAS command is set in none of cycles up to an mth cycle counted from the reference time point in the second cycle time period, output the second RAS command to the storage device in the first cycle time period.

8. The command control system of claim 1, wherein the adjuster circuit includes a switch configured to selectively switch between a first priority mode and a second priority mode, in the first priority mode, when the adjuster circuit adjusts the output timing of the first CAS command and the output timing of the second RAS command, the adjuster circuit forgoes changing the output timing of the first CAS command and changes the output timing of the second RAS command from the cycle set by the setting circuit to the cycle starting from the output end time point of the first CAS command, and in the second priority mode, when the adjuster circuit adjusts the output timing of the first CAS command and the output timing of the second RAS command, the adjuster circuit forgoes changing the output timing of the second RAS command and changes the output timing of the first CAS command from the cycle set by the setting circuit to the cycle starting from the output end time point of the second RAS command.

9. A vehicle, comprising:
the command control system of claim 1; and
a vehicle body equipped with the command control system.

10. A command control method in LPDDR4, comprising:
receiving a first access request and a second access request for access to a storage device, and
setting an output timing of a first RAS command and an output timing of a first CAS command for the first access request and setting an output timing of a second RAS command and an output timing of a second CAS command for the second access request in accordance with a clock signal at which a cycle is repeated; and
adjusting the output timing of the first CAS command and the output timing of the second RAS command,
the second RAS command having a command length corresponding to a multiple of a length of the cycle,
wherein, the adjusting includes, when the output timing of the second RAS command is set in a first cycle time period starting from a reference time point, determining whether or not the second RAS command is output to the storage device in the first cycle time period in accordance with whether or not the output timing of the first CAS command is set in a second cycle time period constituted by a prescribed number of the cycles subsequent to the reference time point.

11. A non-transitory computer-readable medium on which a program configured to cause at least one processor to execute the command control method of claim 10 is recorded.

* * * * *